United States Patent [19]

Hutchison et al.

[11] Patent Number: 5,408,473
[45] Date of Patent: Apr. 18, 1995

[54] METHOD AND APPARATUS FOR TRANSMISSION OF COMMUNICATION SIGNALS OVER TWO PARALLEL CHANNELS

[75] Inventors: Jerry Hutchison, Littleton; Simon A. Ginzburg, Groton, both of Mass.; William C. Mallard, Jr., Nashua, N.H.

[73] Assignee: Digital Equipment Corporation, Maynard, Mass.

[21] Appl. No.: 201,704

[22] Filed: Feb. 25, 1994

Related U.S. Application Data

[63] Continuation of Ser. No. 845,419, Mar. 3, 1992, abandoned.

[51] Int. Cl.$^6$ .............................................. H04J 3/06
[52] U.S. Cl. .................................. 370/100.1; 375/260
[58] Field of Search .................... 375/17, 18, 19, 36, 375/38, 20, 25; 370/37, 112, 118, 100.1, 82, 85.1, 85.2, 85.3, 85.4, 85.5; 455/59; 380/33; 341/58, 59, 95; 371/37.3, 37.4

[56] References Cited

U.S. PATENT DOCUMENTS

| | | | |
|---|---|---|---|
| 3,456,206 | 7/1969 | Kwartiroff et al. | 330/32 |
| 3,465,101 | 9/1969 | Christian et al. | 178/68 |
| 3,733,550 | 5/1973 | Tazaki et al. | 325/38 A |
| 3,980,826 | 9/1976 | Widmer | 178/68 |
| 3,993,953 | 11/1976 | Lender et al. | 325/38 A |
| 4,083,010 | 4/1978 | Looschen | 325/321 |
| 4,371,974 | 2/1983 | Dugan | 375/82 |
| 4,380,815 | 4/1983 | Clendening | 375/80 |
| 4,516,248 | 5/1985 | Barclay et al. | 375/76 |
| 4,523,181 | 6/1985 | Tazaki et al. | 341/58 |
| 4,553,102 | 11/1985 | Yoshida | 329/133 |
| 4,563,767 | 1/1986 | Brandt | 375/107 |
| 4,627,073 | 12/1986 | Shepperd et al. | 375/20 |
| 4,630,286 | 12/1986 | Betts | 375/39 |
| 4,637,036 | 1/1987 | Kobari | 375/76 |
| 4,748,346 | 5/1988 | Emori | 307/270 |
| 4,818,995 | 4/1989 | Takahashi et al. | 341/94 |
| 4,821,298 | 4/1989 | Lagadec et al. | 375/122 |
| 4,823,360 | 4/1989 | Tremblay et al. | 375/4 |
| 4,852,129 | 7/1989 | Schwartz | 375/122 |
| 4,862,485 | 8/1989 | Guinea et al. | 375/120 |
| 4,864,303 | 9/1989 | Ofek | 341/95 |
| 4,866,704 | 9/1989 | Bergman | 370/85.5 |
| 4,932,073 | 6/1990 | Ueda | 455/113 |

(List continued on next page.)

FOREIGN PATENT DOCUMENTS

| | | | |
|---|---|---|---|
| 0213641A2 | 3/1987 | European Pat. Off. | 25/14 |
| 0304081A2 | 2/1989 | European Pat. Off. | 25/49 |

OTHER PUBLICATIONS

Kim, et al, "Run–Length–Limited Variants of Duobinary and Modified Duobinary," IEEE Transactions of Communications, vol. COM–35, No. 2, Feb. 1987, pp. 142–150.

(List continued on next page.)

*Primary Examiner*—Douglas W. Olms
*Assistant Examiner*—Dang Ton
*Attorney, Agent, or Firm*—A. Sidney Johnston; David A. Dagg

[57] ABSTRACT

A technique for synchronizing run-length-limited data transmitted over two parallel narrowband communication channels, such as in a token ring local area network using fiber distributed data interface (FDDI) protocols. A serial data stream to be transmitted is demultiplexed onto the two channels by sending sequential blocks of equal numbers of bits over alternate channels. In a receiver-multiplexer, block boundary synchronization is established during connection initialization by using a property of a required HALT code to detect block boundaries received in each channel. Skew compensation is effected by comparing the times of detection of the block boundaries in the two channels, and appropriately controlling a variable delay in at least one of the channels. The technique establishes reliable block boundary synchronization and skew error compensation during connection initialization, and if there is subsequent loss of synchronization, detected transmission errors will eventually result in connection reinitialization and reestablishment of synchronization.

19 Claims, 2 Drawing Sheets

U.S. PATENT DOCUMENTS

| | | | |
|---|---|---|---|
| 5,097,489 | 3/1992 | Tucci | 375/120 |
| 5,119,402 | 6/1992 | Ginzburg et al. | 375/18 |
| 5,200,979 | 4/1993 | Harris | 375/19 |
| 5,225,287 | 10/1993 | Davies et al. | 375/17 |
| 5,235,617 | 8/1993 | Mallard, Jr. | 375/17 |

FOREIGN PATENT DOCUMENTS

Bingham, "Improved Methods of Accelerating the Convergence of Adaptive Equalizers for Partial-Response Signals", IEEE Transactions of Communications, vol. COM-35, No. 3, Mar. 1987, pp. 257-260.

Kim, et al, "New Runlength-Limited and DC-Free Line Code of Minimum Bandwidth," Electronics Letters, Nov. 25, 1982, vol. 18, No. 24, pp. 1040-1041.

Kalet, et al, "On the Capacity of a Twisted-Wire Pair: Gaussian Model", IEEE Transactions on Communications, vol. 38, No. 3, Mar. 1990, pp. 379-383.

Kim, et al, "A Condition for Stable Minimum-Bandwidth Line Codes," IEEE Transactions on Communications, vol. COM-33, No. 2, Feb. 1985, pp. 152-1157.

Kabal, et al, "Partial-Response Signaling", IEEE Transactions on Communications, vol. COM-23, No. 9, Sep. 1975, pp. 921-934.

Kobayashi, "Coding Schemes for Reduction of Intersymbol Interfenence in Data Transmission Systems", IBM Journal of Research and Development, Jul. 1970, pp. 343-353.

Lender, "Correlative Data Transmission with Coherent Recovery Using Absolute Reference", IEEE Transactions on Communication Technology, vol. COM-16, No. 1, Feb. 1968, pp. 108-115.

Becker, et al., "A New Signal Format for Efficient Data Transmission", B.S.T.J. Briefs, The Bell System Technical Journal, May–Jun. 1966, pp. 755-758.

Kretzmer, "Generalization of a Technique for Binary Data Communication", IEEE Transactions of Communication Technology, 1965, pp. 67-68.

Howsen, "An Analysis of the Capabilities of the Polybinary Data Transmission", IEEE Transactions on Communication Technology, 1965, pp. 312-320.

Sipress, "A New Class of Selected Ternary Pulse Transmission Plans for Digital Transmission Lines", IEEE Transactions on Communication Technology, 1965, pp. 366-372.

Ginzberg, et al, "FDDI Over Unshielded Twisted Pairs", IEEE Computer Society, Proceedings of the 15th Conference on Local Computer Networks, Minneapolis, Minn., Sep. 30-Oct. 3, 1990, pp. 395-398.

Conner, "Color-palette Chips Bundle Extra Features with RAM Look-up Table and DACs", Technology Update, EDN, Sep. 29, 1988, pp. 67-76.

Analog Devices, "ADV478/ADV471"—CMOS 80 MHz Monolithic 2, 256×24(18) Color Palette RAM–DAC, pp. 1-12.

"Special Report—FDDI", Lightwave, Feb. 1991, pp. 32-34, 36, 37, 40, and 42-45.

P. J. Van Gerwen, "Application of Pseudo-Ternary Codes for Data Transmission", Proceedings of the 13th IEEE Congress on Electronic, Rome, 1966, pp. 465-477, IEEE, New York, U.S.A.

A. Lender, et al., "Engineering of the Duobinary Repeatered Line", IEEE International Conference on Communications, Chicago, Ill., 12th-15th Jun. 1977, vol. 1, pp. 306-309, IEEE, New York, U.S.A.

Kolluri, et al, "A 100 Mb/s Clock Recovery and Data Retiming Chip Set".

Product Specification for NE/SA5068 Circuit, Philips Components, Oct. 19, 1989.

Product Specification for NE568A Phase-Locked Loop Circuit, Signetics Company, Jul. 1988.

Kobayashi, "A Survey of Coding Schemes for Transmission or Recording of Digital Data", IEEE Transactions on Communication Technology, vol. COM-19, No. 6, Dec. 1971, pp. 1087-1100.

Franaszek, "Sequence-State Coding for Digital Transmission", The Bell System Technical Journal, Nov. 1967, pp. 143-157.

Feher, "Digital Communications: Microwave Applications", Chapter 7, p. 150.

METHOD AND APPARATUS FOR TRANSMISSION OF COMMUNICATION SIGNALS OVER TWO PARALLEL CHANNELS

This application is a continuation of application Ser. No. 07/845,419, filed Mar. 3, 1992, now abandoned.

BACKGROUND OF THE INVENTION

This invention relates generally to digital multiplexing techniques and, more particularly, to multiplexing as applied to the transmission of digital communication signals over parallel narrowband channels. Local area networks (LANs) use various physical media for signal transmission between network stations or nodes. A widely used standard for communication through optical fibers is known as FDDI (fiber distributed data interface). Optical fibers provide an efficient and reliable data communication medium, but suffer from a significant disadvantage in that they are relatively costly. Pending application Ser. No. 07/545,310, filed on Jun. 26, 1990, now U.S. Pat. No. 5,119,402, and entitled "Method and Apparatus for Transmitting Local Area Network Signals Over Unshielded Twisted Pairs," proposes a solution to this difficulty, using a combination of techniques to transmit signals in accordance with FDDI protocols over parallel narrowband channels in the form of twisted pairs of copper conductors. The present invention is concerned with specific techniques for multiplexing and demultiplexing FDDI-type signals for transmission over parallel narrowband channels.

The use of parallel data channels or data paths is a commonly used technique in various other contexts, to increase the total rate of data flow. The parallel data channels may be two physically separate channels, such as separate twisted pairs of conductors, or may employ two frequencies on a single transmission medium (frequency-division multiplexing), or may employ phase division, with or without carrier signals. There are two commonly used demultiplexing approaches in the prior art.

One approach is to demultiplex data into N channels by simply dividing a binary data stream in a bit-by-bit fashion among the N channels. A first bit goes to the first channel, the next bit to the second channel, and so forth. The principal difficulty with this approach is that there will be possible occurrences of long run lengths of all ones or all zeros in any one channel. In most digital communication coding schemes, transitions of data signals between the zero and one states are used to derive a clock signal at the receiving end of the transmission. When the number of transitions is reduced, deriving a data clock signal from the data itself is rendered more difficult and a separate clock signal may be needed. Long run lengths of an unvarying signal state also require that the receivers be able to receive signals with a direct-current (dc) component. Receivers that are dc-coupled are more sensitive to loss and environmental noise, and are in general more costly than receivers that are not dc-coupled. The net result is that transmission distances are limited if this approach is used. Furthermore, if a separate clock signal is provided, there may be a skew error between the data and clock channels, which further limits the achievable transmission distance.

Another approach to demultiplexing is to transmit separate data packets over the separate channels. In local area networks, messages are encoded into self-contained packets of data, each of which contains its own required addressing and error-checking information. In this approach to demultiplexing, an original data packet is divided into N parts, for transmission over N channels. Then each part is separately encoded to include all the attributes of a data packet, including starting and ending delimiting codes to define the packet boundaries, a packet checksum, destination and source addresses, and other fields that are required in accordance with the communications protocol that defines a data packet. The obvious drawback of this approach is that it requires a large system overhead to demultiplex and multiplex the data, and replication of all the physical channel functions in each of the narrowband channels. Further, the necessary processing in each channel introduces a significant transmission delay.

It will be appreciated from the foregoing that there is a need for a simpler, yet effective approach to demultiplexing and multiplexing data transmitted through multiple narrowband channels. The present invention satisfies this need.

SUMMARY OF THE INVENTION

The present invention resides in apparatus, and a corresponding method, for demultiplexing and multiplexing digital data for transmission over two parallel narrowband channels. Briefly, and in general terms, the method of the invention comprises the steps of demultiplexing a serial digital data stream into at least two parallel data streams, by transmitting successive blocks of n bits of data onto cyclically selected communication channels, where n is at least four; receiving demultiplexed data signals over the communication channels; detecting block boundaries between successive blocks of data received over each channel during a connection initialization phase of operation of the network; and multiplexing the parallel data streams into a single data stream, based on timing signals derived as a result of the step of detecting block boundaries during connection initialization.

The method may also include the further steps of generating an error signal indicative of any difference between the times of detection of block boundaries in the multiple communication channels, and, based on the error signal, applying a controllable time delay to data signals in at least one of the channels, to compensate for any skew error between the channels. In the preferred embodiment of the invention, the number of bits (n) in each data block is four, and the number of communication channels is two.

More specifically, the step of detecting block boundaries includes detecting a binary code sequence received in each channel, which sequence uniquely identifies a block boundary. The binary code sequence appears in each channel as a result of connection initialization. Moreover, the binary code sequence always appears in one channel eight data bits after it appears in the other channel. Therefore, by interposing a fixed time delay in one channel the two parallel data streams can be brought into theoretical alignment for purposes of detecting corresponding block boundaries in the two channels, and measuring any skew error between the channels.

The invention may also be defined in terms of apparatus for multiplexing and synchronizing data from two parallel communication channels, on which an original data stream has been encoded by transmitting successive blocks of n bits of the original data stream over alternate channels. The apparatus comprises means for decoding data received over the two communication channels, to yield two parallel streams of decoded binary data; means for detecting block boundaries in each of the parallel streams of data during some phase of operation of the token ring network; and means for multiplexing the two parallel data streams, based on the detected block boundaries, to recover the original data stream. The apparatus may also include means for determining skew error between the two channels.

More specifically, the means for detecting block boundaries includes means for detecting a preselected binary code sequence in the received parallel data streams. The means for determining the skew error includes variable delay means, controlled in part by the means for detecting a preselected binary code sequence. Measurement of any time difference between corresponding occurrences of the preselected binary code sequence in the two channels is used to control the variable delay means and bring the channels into synchronism. In the disclosed apparatus, the means for detecting block boundaries and the means for determining the skew error are operative only during connection initialization. The preselected binary code sequence always appears at a block boundary in both parallel data streams, and always appears in one parallel data stream at a fixed data-bit interval following its appearance in the other data stream. The apparatus further comprises a delay in one of the data channels, to align the binary code sequences in the two channels and thereby facilitate operation of the means for determining the skew error.

Another feature of the invention is that one of the parallel data streams is delayed, prior to transmission, by a time equivalent to one-half of a data bit interval, to minimize interference between the channels. An additional fixed delay, also equivalent to one-half of a data bit interval, is applied to the other of the parallel data streams prior to multiplexing in the receiver, to compensate for the delay applied prior to transmission.

It will be appreciated from the foregoing that the present invention provides a significant advance in the field of digital data communications. In particular, the invention is a technique for demultiplexing data into parallel channels at a transmitter, and multiplexing the parallel channels again at a receiver, and for automatically synchronizing the parallel channels by detecting block boundaries and compensating for any skew error. Other aspects and advantages of the invention will become apparent from the more detailed description that follows, taken in conjunction with accompanying drawings.

DESCRIPTION OF THE PREFERRED EMBODIMENT

Figure 1:
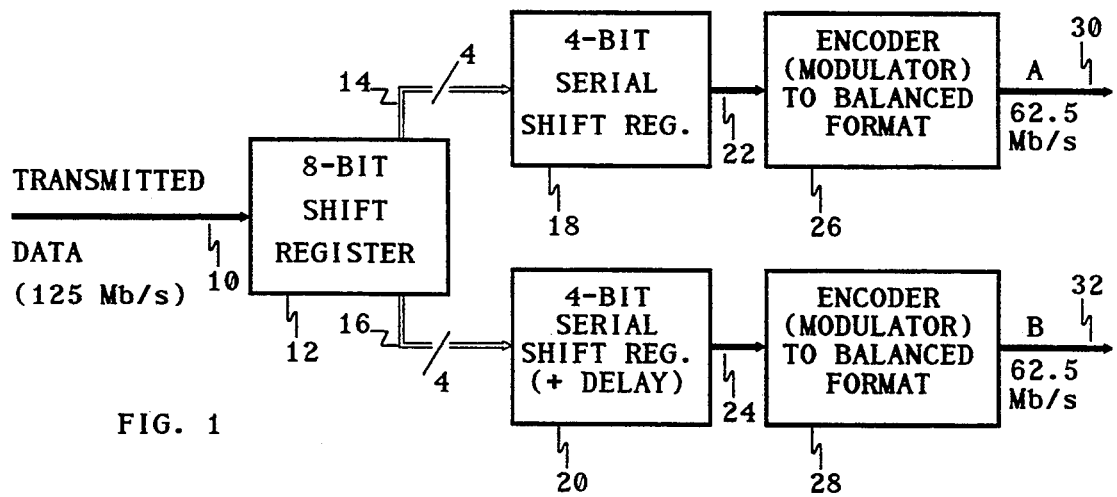
FIG. 1 is a simplified block diagram of transmitter-demultiplexer in accordance with the invention.

As shown in the drawings for purposes of illustration, the present invention is concerned with techniques for demultiplexing and multiplexing digital data for transmission over two parallel narrowband channels, and for providing block boundary synchronization and skew compensation. In computer networks using the protocol known as FDDI (fiber distributed data interface), significant cost reduction can be achieved if the transmission medium takes the form of twisted pairs of copper conductors, rather than optical fibers. However, multiple pairs of conductors are beneficial to achievement of the bandwidth required by the FDDI protocol. Multiple parallel communication channels may instead employ frequency-division multiplexing or phase-division multiplexing.

Demultiplexing schemes of the prior art have included bit-by-bit demultiplexing, wherein each successive bit of data to be transmitted is assigned to the next of N channels, or to alternate channels if only two are used. The difficulty with this scheme is that it provides no control of run lengths of all ones or all zeros, and a channel may have long run lengths without enough data transitions to permit recovery of a data clock signal. In addition, bit-by-bit demultiplexing provides no information for ascertaining the skew error. Another demultiplexing approach assigns entire data packets to each communication channel, but this requires duplication of processing functions in each channel.

Ideally, a better solution would be to demultiplex the data by transmitting several successive bits of data over one channel, then an equal number of bits over the next channel, and so forth, but this scheme presents significant synchronization problems. For example, suppose that sixteen bits of an original data stream to be transmitted are represented as follows: 1, 2, 3, 4, 5, 6, 7, 8, 9, 10, 11, 12, 13, 14, 15, 16, . . . If the demultiplexing scheme splits this stream into "blocks" of four bits each, for transmission over channels A and B, the data transmitted over each channel will appear as follows:

| Channel A: | 1 2 3 4 | 9 10 11 12 | . . . |
| Channel B: | 5 6 7 8 | 13 14 15 16 | . . . |

Detection of a block boundary, between any two consecutive blocks, is clearly very critical to accurate transmission of the data. As shown in this example, the first block boundary is between bits 4 and 9 on channel A and between bits 8 and 13 on channel B. If block synchronism is lost, the integrity of the data is destroyed. For example, if the block boundary is for some reason detected as being between bits 1 and 2 on channel A and between bits 5 and 6 on channel B, the data streams will appear to the receiver as follows, where the X represents a bit preceding or following the sixteen-bit sequence:

| Channel A: | X X X 1 | 2 3 4  9 | 10 11 12 X |
| Channel B: | X X X 5 | 6 7 8 13 | 14 15 16 X |

This represents a one-bit block-boundary missynchronization, in which the original block boundary (4–9 on channel A, 8–13 on channel B) has been moved one bit position to 9–10 on channel A and 13–14 on channel B.

After multiplexing at the receiver, using the incorrect block boundaries, the apparent recovered data stream is:

```
X X X 1 X X X 5 2 3 4 9 6 7 8 13 10 11 12 X 14 15 16 X ...
```

Accordingly, one requirement of a new demultiplexing and multiplexing scheme is that it must provide automatic block boundary correction in the event of block boundary misalignment.

A related requirement is that the demultiplexing and multiplexing scheme has to provide for skew compensation, if necessary, between the two (or more) channels. This is needed if the separate communication channels employ separate physical channels for the transmission of data, as in the case of multiple pairs of twisted conductors. Whenever there are two separate physical channels, there is the possibility of different transmission path lengths and a delay in one channel relative to the other. In the example given above, transmission of the first sixteen bits may be received as:

| Channel A: | 1 2 3 4 | 9 10 11 12 | |
|---|---|---|---|
| Channel B: | X 5 6 7 | 8 13 14 15 | 16 |

This example shows a one-bit skew, wherein channel B is delayed by one bit with respect to channel A. This is by way of example only. Skew error is not always measurable as an integral number of bits.

In accordance with the invention, a required initialization signal transmission in the FDDI protocol is employed to synchronize two parallel communication channels during a period known as the connection initialization, prior to data transmission. Once block boundary synchronization and skew compensation are established during connection initialization, the channels will tend to remain in synchronization for a relatively long period of time. If synchronization is eventually lost, transmission errors will occur. They may be detected and used as an indication that connection should be reinitialized.

By way of further background, in the FDDI system, signals are presented to the physical protocol layer coded in accordance with NRZI encoding. NRZI stands for "nonreturn to zero invert on ones." What this means is that a polarity transition in the signal represents a logical "1" and the absence of a polarity transition represents a logical "0." Further, FDDI signal formats include five-bit code groups. Each transmitted symbol, which may be a four-bit data symbol, or a control symbol, is represented as a five-bit sequence of NRZI bits. This is sometimes referred to as 4B/5B NRZI coding and is the coding format used in the preferred embodiment of the invention. The coding format is discussed in American National Standard ANSI X3.148-1988 defining the physical layer protocol (PHY) for FDDI. One significant advantage of 4B/5B NRZI encoding is that it guarantees a minimum signal transition rate and code balance, and therefore minimizes direct-current components and ensures that a clock signal can be recovered.

HALT symbols possess an advantage of being the first line state transmitted during FDDI connection initialization. [Further information concerning FDDI connection initialization may be found in "FDDI Station Management (SMT)," X3T9.5/84-49, Rev. 6.2, a preliminary draft of a proposed American National Standard, dated May 18, 1990.] Therefore, if synchronization is performed using the HALT signals, all subsequently transmitted signals are properly demultiplexed and multiplexed, since they follow the synchronization function performed during the HALT line state. Another major advantage of the HALT line state is that, after splitting into two channels, it has a repetitive pattern. As will now be illustrated, if a four-bit block length is used the HALT pattern repeats over a 20-bit cycle. The HALT NRZI line state consists of alternating groups of five ones and five zeros, as follows:

```
1 1 1 1 1 0 0 0 0 0 1 1 1 1 1 0 0 0 0 0 1 1 1 1 1 ...
```

When the HALT symbols are split into four-bit blocks, for transmission over channels A and B, the following pattern results:

|    | 1 | 2 | 3 | 4 | 5 | 6 ... |
|----|------|------|------|------|------|---------|
| A) | *1 1 1 1 | 0 0 1 1 | 0 0 0 0 | 1 0 0 0 | 1 1 1 0 | pattern |
| B) | 1 0 0 0 | 1 1 1 0 | *1 1 1 1 | 0 0 1 1 | 0 0 0 0 | repeats |
| A) | *1 1 1 1 | 0 1 1 1 | 0 0 0 1 | 0 0 0 0 | 1 1 0 0 | pattern |
| B) | 0 0 0 0 | 1 1 0 0 | *1 1 1 1 | 0 1 1 1 | 0 0 0 1 | repeats |
| A) | 1 1 1 0 | *1 1 1 1 | 0 0 1 1 | 0 0 0 0 | 1 0 0 0 | pattern |
| B) | 0 0 0 0 | 1 0 0 0 | 1 1 1 0 | *1 1 1 1 | 0 0 1 1 | repeats |
| A) | 1 1 0 0 | *1 1 1 1 | 0 1 1 1 | 0 0 0 1 | 0 0 0 0 | pattern |
| B) | 0 0 0 1 | 0 0 0 0 | 1 1 0 0 | *1 1 1 1 | 0 1 1 1 | repeats |
| A) | 1 0 0 0 | 1 1 1 0 | *1 1 1 1 | 0 0 1 1 | 0 0 0 0 | pattern |
| B) | 0 0 1 1 | 0 0 0 0 | 1 0 0 0 | 1 1 1 0 | *1 1 1 1 | repeats |
| A) | 0 0 0 0 | 1 1 0 0 | *1 1 1 1 | 0 1 1 1 | 0 0 0 1 | pattern |
| B) | 0 1 1 1 | 0 0 0 1 | 0 0 0 0 | 1 1 0 0 | *1 1 1 1 | repeats |
| A) | 0 0 0 0 | 1 0 0 0 | 1 1 1 0 | *1 1 1 1 | 0 0 1 1 | pattern |
| B) | *1 1 1 1 | 0 0 1 1 | 0 0 0 0 | 1 0 0 0 | 1 1 1 0 | repeats |
| A) | 0 0 0 1 | 0 0 0 0 | 1 1 0 0 | *1 1 1 1 | 0 1 1 1 | pattern |
| B) | *1 1 1 1 | 0 1 1 1 | 0 0 0 1 | 0 0 0 0 | 1 1 0 0 | repeats |
| A) | 0 0 1 1 | 0 0 0 0 | 1 0 0 0 | 1 1 1 0 | *1 1 1 1 | pattern |
| B) | 1 1 1 0 | *1 1 1 1 | 0 0 1 1 | 0 0 0 0 | 1 0 0 0 | repeats |
| A) | 0 1 1 1 | 0 0 0 1 | 0 0 0 0 | 1 1 0 0 | *1 1 1 1 | pattern |
| B) | 1 1 0 0 | *1 1 1 1 | 0 1 1 1 | 0 0 0 1 | 0 0 0 0 | repeats |

The ten double rows of the above table represent ten possible starting points, or phases, for demultiplexing of the ten-bit repeating HALT pattern shown above the table. Lines A and B of each double row correspond to channels A and B. The column numbers represent successive block numbers for each of the possible starting points of the HALT pattern. For example, the first row the first block begins with the first of five 1's in the HALT sequence. The first four 1's appear on channel A and the fifth on channel B. Then three 0's appear on channel B and the remaining two 0's on channel A, and so forth. The second double row begins with the second of the five 1's of the HALT pattern, the third double row begins with the third of five 1's, and so forth. Observation of this table reveals an interesting and useful property: There are only two repetitive twenty-bit patterns in each of the A and B channels, regardless of the starting point or phase of the HALT symbol. One of the patterns is:

| 1 1 1 1 | 0 0 1 1 | 0 0 0 0 | 1 0 0 0 | 1 1 1 0. |
|---|---|---|---|---|

The pattern can be seen, for example, in the first row for channel A (beginning with the first block), and in the first row for channel B (beginning with the third block). The second pattern is the inverse of the first:

| 0000 | 1100 | 1111 | 0111 | 0001. |

The second pattern can be seen, for example, in the sixth row for channel A (beginning in the first block), and in sixth row for channel B (beginning in the third block). In every occurrence of the patterns, they are separated in rows A and B by eight bits (two blocks).

Therefore, these patterns provide an unambiguous and reliable indication of block boundaries. One way to detect the boundaries would be to use two 20-bit comparators, but the same result can be achieved with only a single five-bit comparator, using a sequence of bits that is found in both repetitive patterns. For example, the code sequence 01111 appears in both patterns and appears only once at a unique position in the patterns. The code sequence 01111 is marked by an asterisk in the table, and it will be observed that the sequence always appears on channel B exactly eight bits following its occurrence in channel A. Since there is always a block boundary in the code sequence 01111 (between the zero and the four 1's), detection of the code sequence is a reliable technique for locating block boundaries, regardless of the starting point, or relative phase, of the transmitter.

Because the transmitter phase may be any value in the synchronization scheme of the invention, the transmitter-demultiplexer is of relatively simple design, as shown by way of example in FIG. 1. Data signals to be transmitted are input serially over a line indicated by reference numeral 10, to an eight-bit shift register 12, which splits the data into two streams of four-bit-wide data, on lines 14 and 16, respectively. These lines input data to separate four-bit serial shift registers 18 and 20, which effect a parallel-to-serial transformation, producing two serial data streams on lines 22 and 24, respectively. Signals on the latter two lines are input to encoders or modulators 26 and 28, which output data on lines 30 and 32, respectively, in a desired balanced format, such as PR-4, for transmission over channels A and B. In a preferred embodiment, the input data on line 10 appears at a rate of 125 megabits per second (Mb/s), and the data rate on each of the output lines 30 and 32 is at half that rate, or 62.5 Mb/s.

To prevent synchronous addition of near end crosstalk from both channels, interfering with channels transmitting in opposite directions, the signals on one of the channels is delayed by half of a bit duration, indicated as a T/2 delay in the four-bit serial shift register 20 for channel B. As will be described, a similar delay is applied to the other channel at the receiving end, to bring the channels into proper synchronism for multiplexing in the receiver.

Various detailed implementations may be employed in the transmitter-demultiplexer to achieve the functions broadly described with reference to FIG. 1. The bit manipulations needed are shown by way of further explanation in FIG. 2, which, when appropriate, uses the same reference numerals as are used in FIG. 1.

Figure 2:
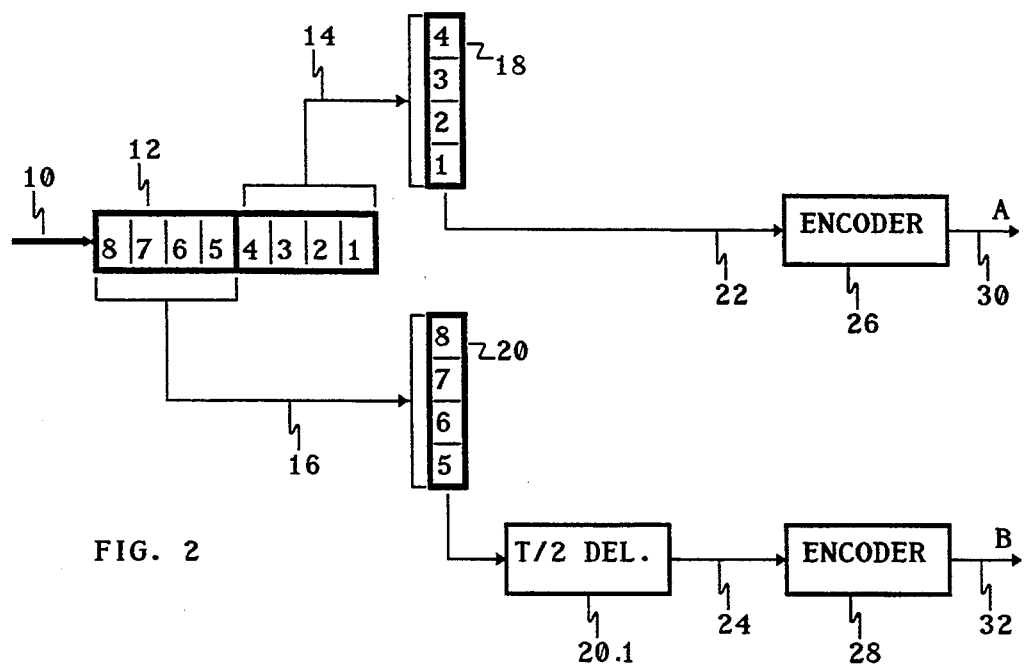
FIG. 2 is a block diagram similar to FIG. 1, with bit numbering shown for purposes of explanation.

As shown in FIG. 2, data bits are shifted serially into the eight-bit shift register 12, and clocked out of the register as two groups of four bits each. Thus, bits 1-8 input to the register 12 are output from the register as two groups 1-4 on channel A and 5-8 on channel B. Then each group of four bits is shifted serially out of the registers 18 and 20, respectively, to provide the desired parallel data streams on lines 22 and 24. The additional T/2 delay for channel B is indicated as a separate block 20.1 in FIG. 2.

Figure 3:
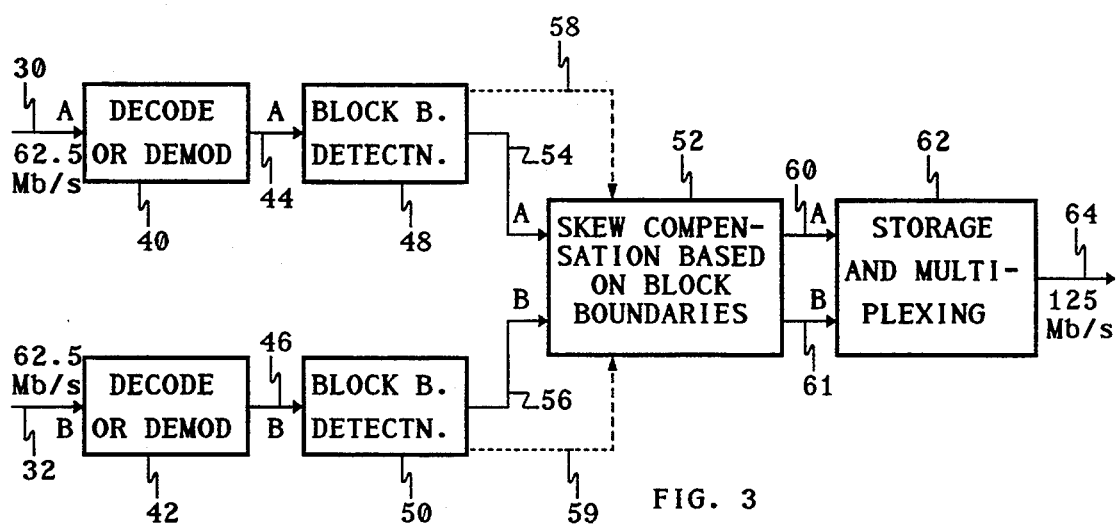
FIG. 3 is a simplified block diagram of a receiver-multiplexer in accordance with the invention.

The receiver-multiplexer, shown in FIG. 3, performs block boundary detection and skew compensation based on the unique repetitive code sequence found during the initialization step. Signals received on lines 30 and 32 (channels A and B) are first processed by decoders 40 and 42, respectively. Decoding reduces the incoming signals to binary signals, and may include a demodulator, if a radio-frequency (rf) carrier is used for transmission, as well as clock extraction, data retiming, and signal detection circuitry. After decoding, the signals on the two channels are transmitted over lines 44 and 46 to pattern recognition circuits 48, and 50, respectively.

The pattern recognition circuits 48 and 50 operate during the HALT phase of connection initialization to detect the unique code sequence (01111) selected as defining block boundaries in the demultiplexed data. To facilitate block boundary synchronization, channel A is temporarily delayed to align the unique sequence in the two channels, and is also delayed by T/2 compensate for the T/2 delay imposed on channel B in the transmitter-demultiplexer. The pattern recognition circuits 48 and 50 send the channel A and B data signals to a skew compensation circuit 52, over lines 54 and 56, respectively, and send control signals over lines 58 and 59, respectively, to the skew compensation circuit. Skew compensation is effected by adjusting a variable delay in one of the channel signals. The skew compensated signals are output from the compensation circuit 52, over lines 60 and 61, respectively, to a multiplexing circuit 62, which assembles the two parallel data streams from channels A and B into a single stream for output on line 64, using the block boundaries detected in the pattern recognition circuits 48 and 50. The storage and multiplexing circuit 62 includes the delay applied to channel B, to restore synchronism to the channels, and an appropriate arrangement of shift registers connected to multiplex the data for serial output on line 64. For example, an arrangement of registers similar to those used in the transmitter-demultiplexer could also be used for multiplexing the four-bit blocks of data into a single serial stream.

Figure 4:
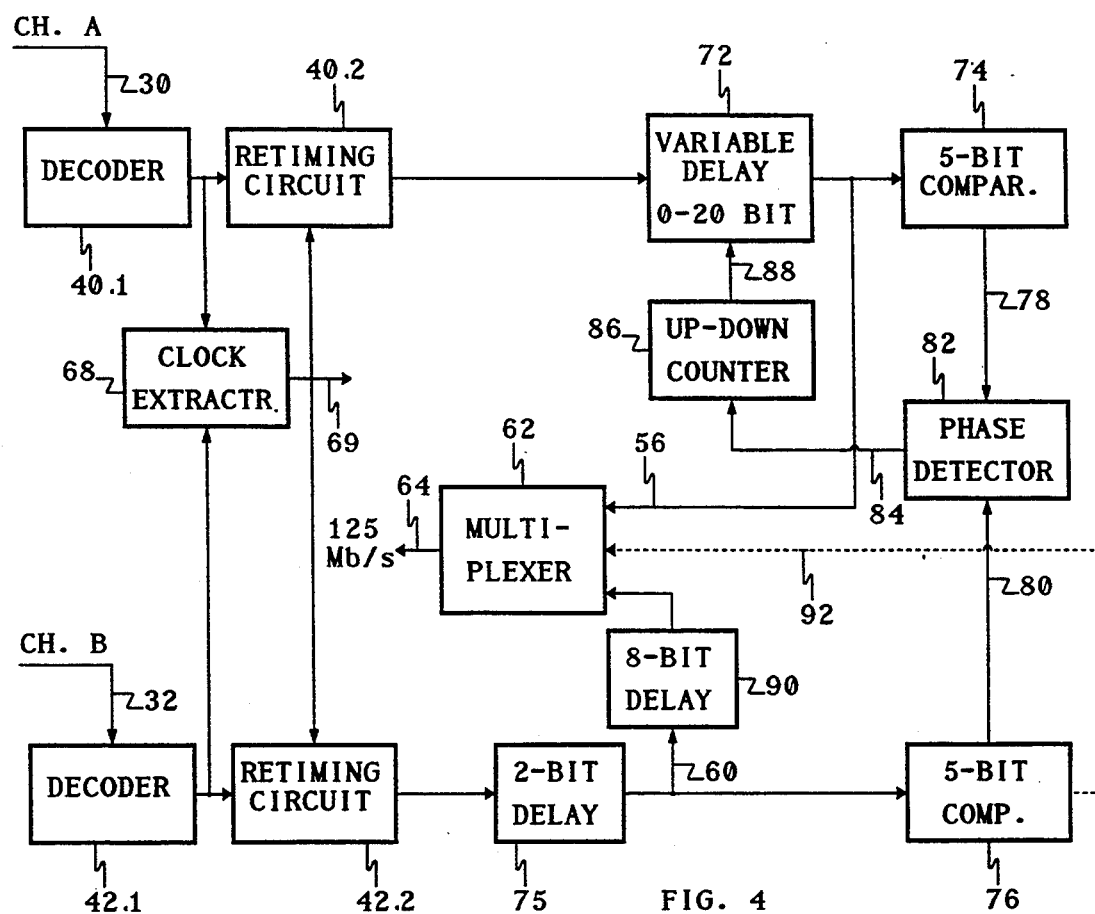
FIG. 4 is a more detailed block diagram of a receiver-multiplexer, depicting an illustrative implementation of the receiver-multiplexer.

FIG. 4 shows a more detailed implementation of the receiver-multiplexer of FIG. 3, by way of further illustration. The decoder 40 for channel A is shown as including decoder 40.1 and a retiming circuit 40.2. Similarly, the decoder 42 for channel B includes decoder 42.1 and a retiming circuit 42.2. A clock extractor 68 processes signals output from the decoders 40.1 and 42.1 and generates data clock signals on line 69. The clock signals are used in the retiming circuits 40.2 and 42.2 to provide synchronous streams in both the channels, and are also used to control the timing of other components of the receiver-multiplexer. After decoding, the decoded channel A signal is subject to a variable digital delay, as indicated in block 72, the purpose of which is to provide skew compensation between the two channels. The variable delay 72 has a range of 0-20 data bit times, and a nominal setting at the midpoint of this range.

The delayed channel A signal is input to a five-bit comparator 74. The comparator compares all incoming groups of five bits with the five-bit code sequence 01111 that is indicative of a block boundary. The channel B signal is subject to a two-bit delay in block 75, and is then input to another five-bit comparator 76. Since the channel A signals are subject to a ten-bit delay and the channel B signals are subject to a two-bit delay, the channel A signals arriving at comparator 74 are delayed by eight bits relative to the channel B signals arriving at comparator 76. Therefore, if the channels are in proper synchronism the five-bit code sequence 01111 indicative of a block boundary will be detected in both comparators simultaneously. Output signals from the comparators 74 and 76, on lines 78 and 80, indicate the detection of block boundaries in each of the channels A and B, and are coupled to a phase comparator 82, which produces an output on line 84 to an up-down counter 86. The phase comparator output indicates both the sign and magnitude of any skew error detected as a difference in phase between the block boundaries in the two channels. The skew error is averaged in the up-down counter 86, which provides a control signal on line 88 to the variable digital delay circuit 72. Varying this delay circuit above or below the its nominal setting of a ten-bit delay compensates for any skew errors between the two channels.

The channel A signals output from the variable delay circuit 72 are transmitted over line 56 to the multiplexer 62, and the channel B signals output from the two-bit delay 75 are transmitted over line 60 to the multiplexer, but through an additional delay circuit 90, which interposes a fixed eight-bit delay. The eight-bit delay circuit 90 restores the channel A and channel B signals to synchronism for processing in the multiplexer 62. The multiplexer 62 is controlled in part by block boundary detection signals provided by one of the five-bit comparators 74 and 76, as indicated by line 92 from comparator 76 to the multiplexer. This block boundary control function can be implemented in a variety of ways. In essence, the multiplexer 62 will normally determine block boundaries by counting bits from one boundary to the next in each channel. Control signals on line 92 may be used, for example, to reset one or more bit counters in the multiplexer, to record the alignment of block boundaries during connection initialization. The multiplexer 62 combines the two data streams on lines 56 and 60 into a single output data stream on line 64.

Data clock signals derived from the clock extractor 68 are coupled to delay circuits 72, 75 and 90, as well as to the comparators 74 and 76, and to the multiplexer 62. For simplicity, connections of the various clocking signals are not shown.

From the foregoing description of FIG. 4, it will be understood that the received data signals are subject to three different types of time delay. First, a deliberate eight-bit skew is temporarily imposed in the receiver-multiplexer, to facilitate detection of block boundaries. Second, a deliberate 0.5 bit skew is added before transmission, and removed in the receiver-multiplexer, to decrease cross-talk interference between the channels. It is removed by using a single retiming clock for both channels. Third, an unknown and, in general, variable skew arises because of physical differences between the channels. In many implementations, this skew is much less than a single bit period and can be neglected.

If there is no skew of the third type, due to physical differences between the channels, the variable delay 72 provides a ten-bit delay. If there is skew of the third type, the up-down counter 86 adjusts the variable delay 72 until block boundaries are detected simultaneously in both channels. Since both pulse trains (channels A and B) are synchronous (after retiming), we do not have to deal with fractions of a bit.

The selection of a four-bit block size for demultiplexed data is not critical to the invention, but is consistent with the presently preferred embodiment. The 4B/5B FDDI coding format mentioned earlier has data symbols that can represent up to three consecutive bits without a signal transition. Therefore, the number of bits in the demultiplexed blocks must be at least four in order to avoid unlimited run lengths of ones or zeros. Moreover, some combinations of FDDI symbols have a four-bit run length, so a block length of at least four bits is advisable. A block length of five bits is inadvisable because the FDDI control symbols HALT and MASTER LINE STATE consist of five and ten bits without transition, which may therefore demultiplex into unlimited run lengths of ones or zeros on each channel. A four-bit block length may still result in run lengths up to six (for the MASTER LINE STATE), with occasional, nonrepetitive seven-bit run lengths for some data symbol combinations. For the HALT line state, the maximum run length is four bits.

The previous paragraph assumes that the standard 4B/5B NRZI format is used for FDDI. An alternative NRZ coding format for FDDI results in longer, and potentially unlimited run lengths.

In summary, the receiver-multiplexer of the invention functions by detecting block boundaries in both demultiplexed channels while the HALT symbol is being transmitted during connection initialization, automatically correcting for skew between the two data streams, and multiplexing the two streams into one serial stream, based on the timing of the detected block boundaries during ring initialization. Operation of the FDDI token ring network after ring initialization continues to use the timing information derived during the HALT symbol phase of the initialization. For example, any skew error continues to be compensated by the variable digital delay 72 (FIG. 4), and data blocks are manipulated in the multiplexer 62 based on the timing of block boundaries detected during the initialization phase. If block boundary synchronization is lost for some reason, or if there is a significant cumulative change in the skew error, the integrity of the data bit sequence will also be lost and transmission errors will be detected, eventually requiring connection reinitialization. Block boundary synchronization and skew compensation will be performed automatically during reinitialization, so the mechanism for synchronization is a self-healing one in this respect.

The approach taken in the invention has the additional advantage that the original data stream is transmitted (as multiple demultiplexed streams), without any additions or deletions to it, i.e. no new packets are created and the duplication of packet processing hardware is avoided.

It will be appreciated from the foregoing that the present invention represents a significant advance in the field of local area networks using a transmission medium that necessitates demultiplexing of data into two or more channels. Specifically, the invention applies to demultiplexing and multiplexing data for transmission over a token ring network using FDDI protocols, and provides for automatic block boundary synchronization and skew error compensation during connection initialization. It will also be appreciated that, although a specific embodiment of the invention has been described in detail by way of illustration, various modifications may be made without departing from the spirit and scope of the invention. Accordingly, the invention is not to be limited except as by the following claims.

We claim:

1. A method for transmitting a run-length-limited data stream in parallel over at least two communication channels, comprising the steps of:
    demultiplexing a serial digital data stream into at least two parallel data streams, by transmitting successive blocks of n bits of data onto cyclically selected communication channels, wherein n is at least four;
    receiving demultiplexed data signals over the communication channels;
    detecting block boundaries between successive blocks of data received over each of said channels; and
    multiplexing said at least two parallel data streams into a single data stream, based on timing signals derived as a result of said step of detecting block boundaries.

2. A method as defined in claim 1, wherein the step of transmitting data over the communication channels is performed using a 4B/5B coding format as defined by the Fiber Distributed Data Interface (FDDI) Token Ring Physical Layer Protocol (PHY).

3. A method as defined in claim 1, and further comprising the steps of:
    generating an error signal indicative of any difference between the times of detection of block boundaries in the communication channels; and
    based on the error signal, applying a controllable time delay to data signals in at least one of the channels, to compensate for any skew error between the channels.

4. A method as defined in claim 1, wherein:
    the number of bits (n) in each data block is four; and
    the number of communication channels is two.

5. A method as defined in claim 3, wherein:
    the number of bits (n) in each data block is four; and
    the number of communication channels is two.

6. A method as defined in claim 1, wherein the step of detecting block boundaries includes:
    detecting a binary code sequence received in said each of said channels, said binary code sequence uniquely identifying a block boundary.

7. A method as defined in claim 6, wherein:
    the binary code sequence appears in said each of said channels as a result of transmission of a HALT code sequence during ring initialization.

8. A method as defined in claim 7, wherein: there are two communication channels and the number of bits (n) in each block is four; and
    the binary code sequence always appears in one of said channels eight data bits after it appears in the other of said channels.

9. For use in a 4B/5B encoded transmission system, a method for transmitting data in parallel over two communication channels, comprising the steps of:
    demultiplexing a serial digital data stream into two parallel data streams, by transmitting successive blocks of four bits of data onto alternate communication channels;
    receiving demultiplexed data signals over the two communication channels;
    detecting block boundaries between successive blocks of data received over each of said channels;
    detecting any skew error between the two channels by measuring the phase difference between the block boundaries in the two channels; controllably delaying one of the parallel data streams to compensate for any detected skew error between the two channels; and
    multiplexing said two parallel data streams into a single data stream, based on timing signals derived as a result of the step of detecting block boundaries during the initialization.

10. A method as defined in claim 9, wherein the step of detecting block boundaries includes:
    detecting a binary code sequence received in said each of said channels, said binary code sequence uniquely identifying a block boundary.

11. A method as defined in claim 10, wherein:
    the binary code sequence appears in said each of said channels as a result of transmission of a HALT code sequence during initialization.

12. A method as defined in claim 11, wherein:
    the binary code sequence always appears in one of said channels eight data bits after it appears in the other of said channels.

13. A method as defined in claim 12, wherein:
    the HALT code sequence comprises alternating groups of five ones and five zeros;
    after the demultiplexing step, the HALT code sequence appears in said each of said channels as one of two possible repetitive twenty-bit codes; and
    the binary code sequence that uniquely identifies block boundaries appears in both possible repetitive twenty-bit codes.

14. For use in transmitting a run-length-limited data stream, apparatus for multiplexing and synchronizing data from two parallel communication channels, on which an original data stream has been encoded by transmitting successive blocks of n bits of the original data stream over alternate channels, the apparatus comprising:
    means for decoding data received over the two communication channels, to yield two parallel streams of decoded binary data;
    means for detecting block boundaries using a code sequence established during initialization of the original data stream in each of the parallel streams of data during operation of a token ring network; and
    means for multiplexing said two parallel streams of decoded binary data, based on the detected block boundaries, to recover the original data stream.

15. Apparatus as defined in claim 14, and further comprising:
    means for compensating for skew error between the two channels.

16. Apparatus as defined in claim 15, wherein:
    the means for detecting block boundaries includes means for detecting a preselected binary code sequence in the received parallel data streams; and
    the means for compensating for skew error is responsive to said means for detecting a preselected binary code sequence, and includes variable delay means;
    wherein said detection of the preselected binary code sequence at different times in the two channels is used to control the variable delay means and bring the channels into synchronism.

17. Apparatus as defined in claim 16, wherein:
    the means for detecting block boundaries and the means for compensating for skew error are operative only during transmission of a HALT signal state during initialization;

the preselected binary code sequence always appears at a block boundary in both parallel data streams, and always appears in one of said parallel data streams at a fixed data-bit interval following its appearance in the other of said parallel data streams; and the apparatus further comprises a fixed delay in one of the data channels, to align the binary code sequences in the two channels and thereby facilitate operation of the means for compensating for skew error.

18. Apparatus as defined in claim 17, wherein:

one of the parallel data streams is delayed, prior to transmission, by a time equivalent to one-half of a data bit interval, to minimize interference between the channels; and the apparatus further comprises an additional fixed delay also equivalent to one-half of a data bit interval, applied to the other of the parallel data streams to compensate for the delay applied prior to transmission.

19. Apparatus as defined in claim 17, wherein:

the means for detecting block boundaries includes a multibit digital comparator in each of said channels, for comparing strings of successively received binary signals with the preselected binary code sequence; and the means for compensating for skew error includes a phase detector coupled to the digital comparators in both channels, to provide a measure of skew error between the channels.

* * * * *